(12) United States Patent
Duan

(10) Patent No.: US 8,897,026 B2
(45) Date of Patent: Nov. 25, 2014

(54) LOCKING ASSEMBLY AND ELECTRONIC DEVICE USING THE SAME

(75) Inventor: Ju-Ping Duan, Shenzhen (CN)

(73) Assignees: Fu Tai Hua Industry (Shenzhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 149 days.

(21) Appl. No.: 13/474,971

(22) Filed: May 18, 2012

(65) Prior Publication Data

US 2013/0114222 A1 May 9, 2013

(30) Foreign Application Priority Data

Nov. 4, 2011 (CN) .......................... 2011 1 0345361

(51) Int. Cl.
*H05K 7/00* (2006.01)
*H05K 1/14* (2006.01)
*H05K 1/00* (2006.01)
*H05K 1/18* (2006.01)
*H05K 5/00* (2006.01)
*H05K 7/14* (2006.01)

(52) U.S. Cl.
CPC ...................................... *H05K 7/142* (2013.01)
USPC ........... 361/759; 361/728; 361/736; 361/740; 361/742; 361/747; 361/748; 361/758; 455/575.1

(58) Field of Classification Search
CPC ..... H05K 5/00; H05K 5/0043; H05K 5/0052; H05K 5/006; H05K 7/14; H05K 7/142; H05K 2201/2036
USPC ......... 361/759, 740, 742, 758, 728, 736, 747, 361/748; 455/575.1
See application file for complete search history.

(56) References Cited

U.S. PATENT DOCUMENTS

| | | | | |
|---|---|---|---|---|
| 6,481,942 | B2 * | 11/2002 | Tanaka ............................ | 411/45 |
| 6,542,372 | B1 * | 4/2003 | Paquin et al. ................. | 361/758 |
| 2005/0201070 | A1 * | 9/2005 | Fan et al. ...................... | 361/753 |

* cited by examiner

*Primary Examiner* — Anthony Haughton
*Assistant Examiner* — Zhengfu Feng
(74) *Attorney, Agent, or Firm* — Novak Druce Connolly Bove + Quigg LLP

(57) ABSTRACT

A locking assembly includes a guiding post and a hollow locking member. The guiding post includes a locking portion. A clamp hook is formed on a flange of the locking portion. The locking member includes an opening end. The locking member sleeves on the locking portion of the locking member, in which at least one clamping depression is formed on an inner wall of the locking member corresponding to the clamp hook, and the clamp hook is clamped in one clamping depression.

14 Claims, 5 Drawing Sheets

LOCKING ASSEMBLY AND ELECTRONIC DEVICE USING THE SAME

BACKGROUND

1. Technical Field

The present disclosure generally relates to locking assemblies, and particularly to a locking assembly for locking the circuit board in an electronic device.

2. Description of Related Art

Circuit boards are usually locked within the housing via screws in the electronic devices. During assembly or disassembly of the circuit boards, the screws are fastened or disassembled by means of screwdrivers. The screws and the circuit boards are easily be damaged if the amount of power or force used when controlling or turning the screwdrivers is not adjustable during the assembly or disassembly of the circuit board.

Therefore, there is room for improvement within the art.

BRIEF DESCRIPTION OF THE DRAWINGS

The components in the drawings are not necessarily drawn to scale, the emphasis being placed upon clearly illustrating the principles of the present disclosure. Moreover, in the drawings, like reference numerals designate corresponding parts throughout several views, and all the views are schematic.

DETAILED DESCRIPTION

Figure 1:
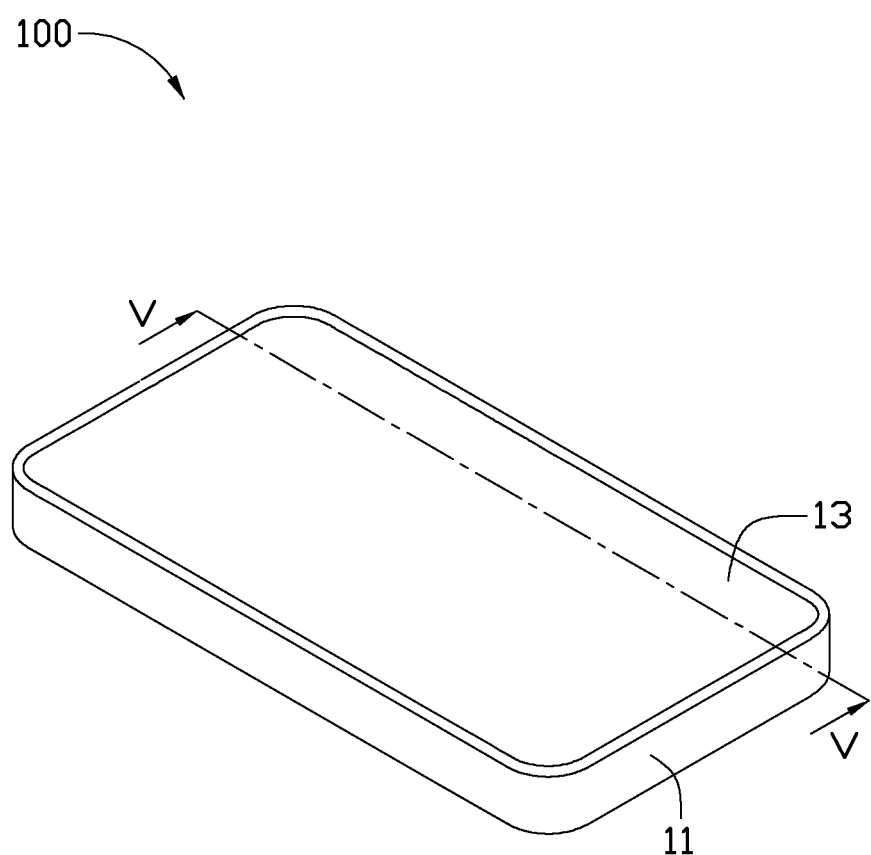
FIG. 1 shows an isometric view of an embodiment of an electronic device.
Figure 2:
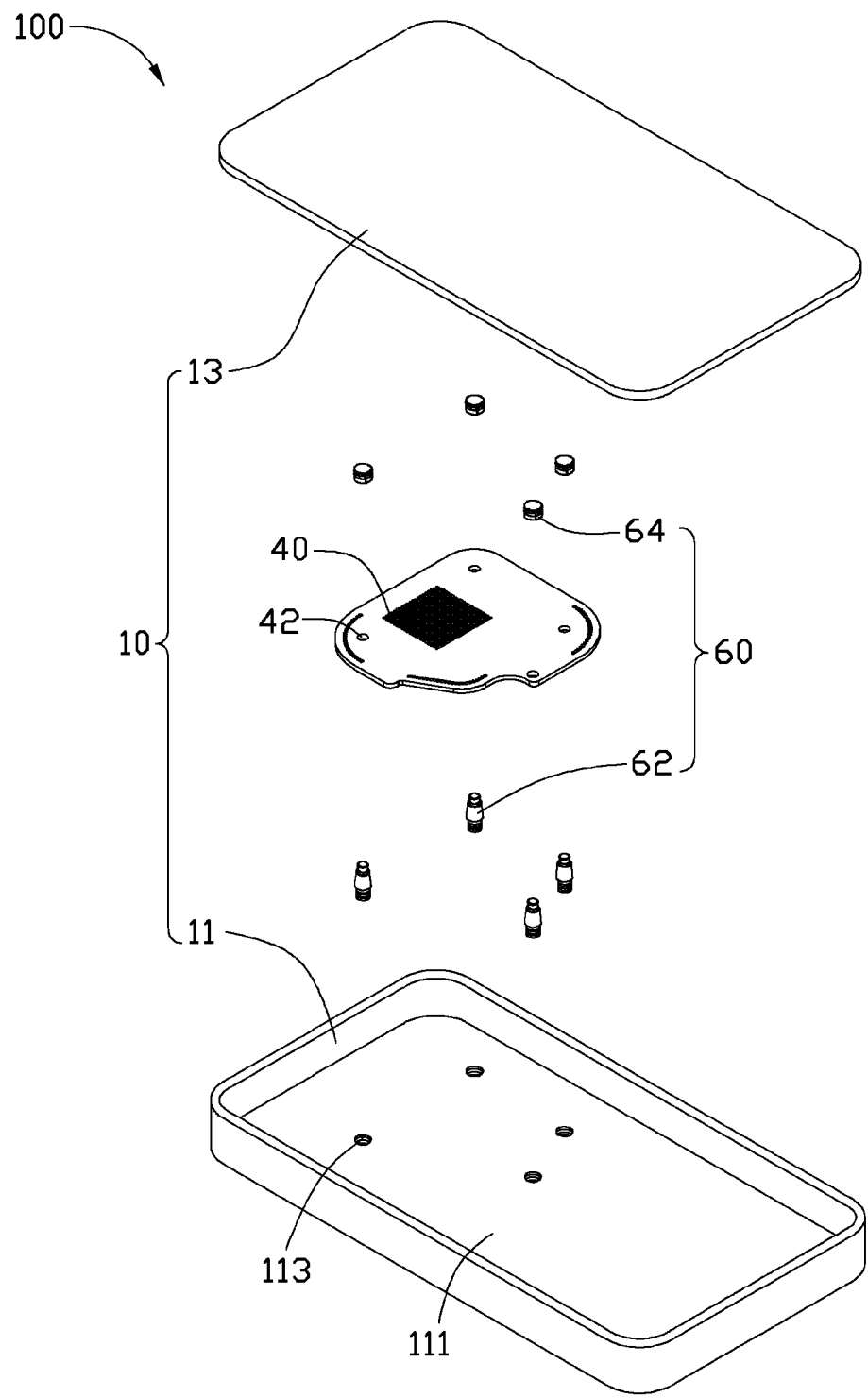
FIG. 2 is an exploded, isometric view of the electronic device of the FIG. 1, the electronic device including a guiding post and a locking member.

Referring to FIGS. 1 and 2, an embodiment of an electronic device 100 including a housing 10, a circuit board 40 and, a plurality of locking assemblies 60 is shown. The circuit board 40 is detachably positioned in the housing via the locking assemblies 60. The electronic device 100 also includes various other functional modules for performing specific functions. However, for simplicity, it is not described here.

The housing 10 includes a bottom housing 11 and a top cover 13 mounted on the bottom housing 11. A bottom wall 111 is formed in the bottom of the bottom housing 11. Four mounting holes 113 are separately defined in the bottom wall 111.

The circuit board 40 is detachably mounted on the bottom wall 111 via the four locking assemblies 60. Four installation holes 42 are defined through the circuit board 40 corresponding to the four mounting holes 113.

Each locking assembly 60 includes a guiding post 62 and a locking member 64. The guiding post 62 is fixed in the corresponding mounting hole 113. The locking member 64 sleeves on the guiding post 62 for locking the circuit board 40 on the guiding post 62.

Figure 3:
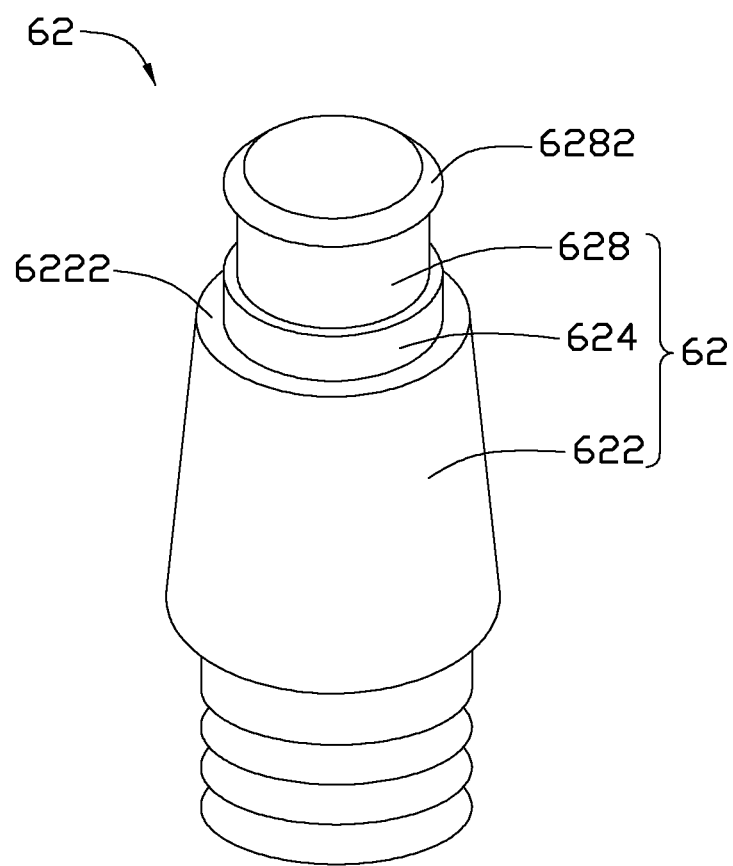
FIG. 3 is an enlarged, isometric view of the guiding post of the electronic device of FIG. 2.
Figure 4:
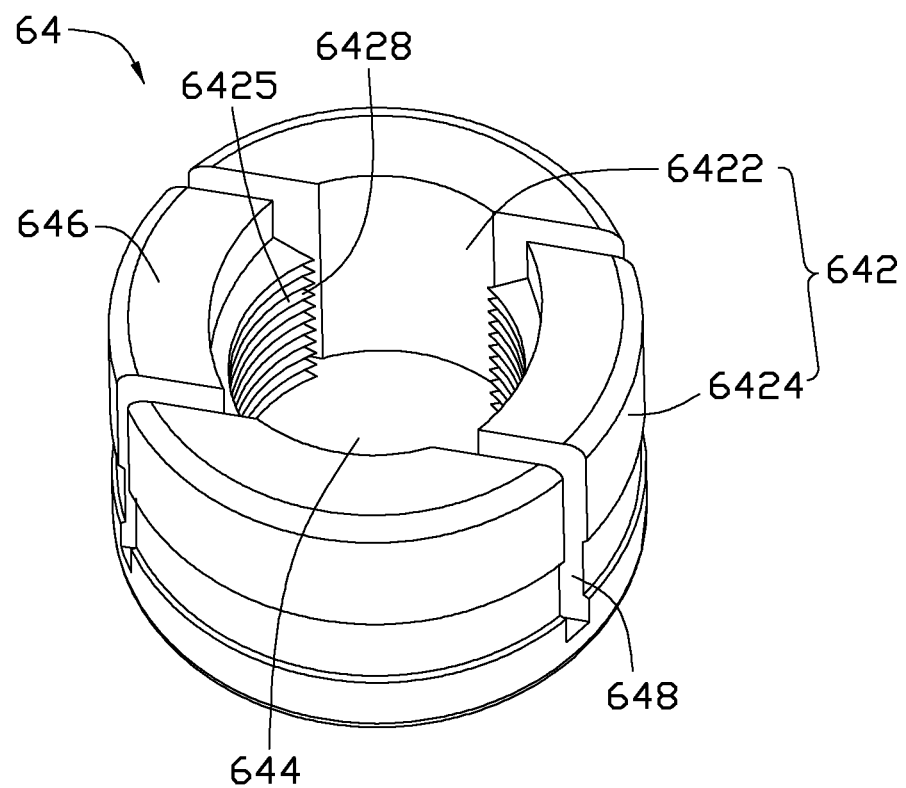
FIG. 4 is an enlarged, isometric view of the locking member of the electronic device of FIG. 2.
Figure 5:
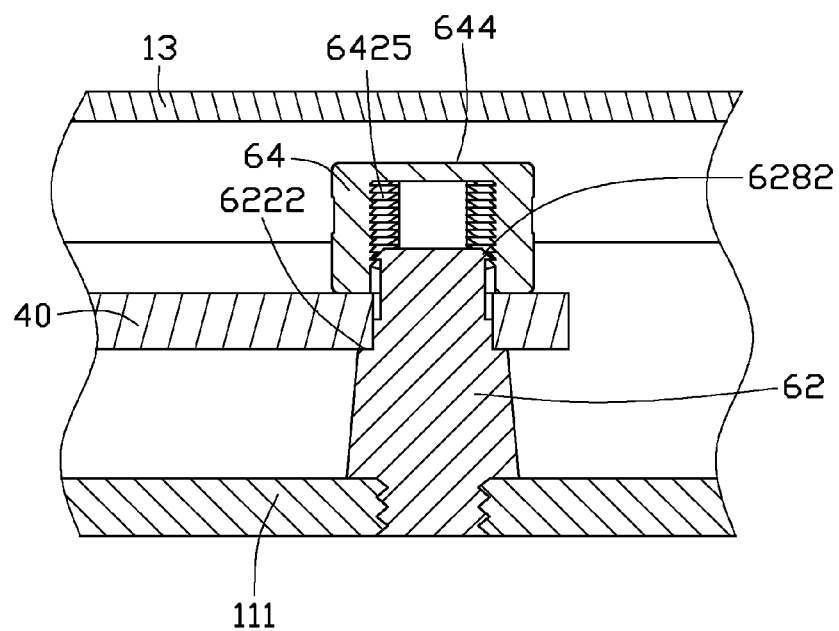
FIG. 5 is a cross-section of the electronic device of FIG. 1, taken along a line labeled as V-V.

Referring to the FIGS. 3 through 5, the guiding post 62 is detachably positioned in one mounting hole 113 for supporting the circuit board 40. In an alternative embodiment, the guiding posts 62 and the bottom wall 111 can be integrally formed. The guiding post 62 includes a support portion 622, a guiding portion 624, and a locking portion 628. The support portion 622, the guiding portion 624, and the locking portion 628 are configured and aligned in a same axis. The support portion 622 connects with the guiding portion 624 at on end thereof, and forms several external threads on the opposite end thereof away from the support portion 622 to be detachably positioned in one mounting hole 113 of the housing 10.

The guiding portion 624 is substantially a cylinder, located between the support portion 622 and the locking portion 628. A diameter of the guiding portion 624 is smaller than a diameter of the support portion 622. A guiding surface 6222 is formed on an end surface of the support portion 622 connecting with the guiding portion 624. The guiding surface 6222 is used for guiding the circuit board 40 to move along in the direction substantially perpendicularly to the circuit board 40 during the electronic device 100 assembly. The diameter of the guiding portion 624 is equal to that of the installation hole 42 for guiding the level or planar direction of the circuit board 40 during the assembly. The locking portion 628 is connected with the guiding portion 624 away from the support portion 622 for engaging with the locking member 64. The locking portion 628 is substantially a cylinder. The diameter of the locking portion 628 is smaller than that of the guiding portion 624. A clamp hook 6282 is formed on a flange of an end of the locking portion 628 away from the guiding portion 624.

The locking member 64 sleeves on the locking portion 628. The locking member 64 is engaging with the locking portion 628 for fixing the circuit board 40 on the guiding post 62. The locking member 64 is made of plastic or elastic materials. In the illustrated embodiment, the locking member 64 is made of plastic materials. The locking member 64 is a substantially hollow cylinder, and includes a main body 642, a capped end 644, and an opening end 646. The capped end 644 and the opening end 646 are formed at the opposite ends of the main body 642.

The main body 642 includes an inner wall 6422 and an outer wall 6424. Four buffer grooves 648 are further separately formed on the main body 642. The buffer groove 648 extends along the central axis of the locking member 64 from an end surface of the opening end 646 toward and adjacent to the capped end 644. Each pair of the four buffer grooves 648 are aligned in a same plane, such that two clamping portions 6425 are symmetrically formed on the inner wall 6422 between the two planes defined by the buffer grooves 648 for engaging with the locking portion 628. Several clamping depressions 6428 are recessed on the inner wall 6422. The width of the clamping depression 6428 is corresponding to the height of the clamping hook 6282.

In assembly, the circuit board 40 sleeves on the guiding portions 624 via the installation holes 42, such that one side of the circuit board 40 facing the bottom wall 111 resists against the guiding surfaces 6222. Each locking member 64 sleeves on each guiding post 62. A pressure perpendicularly to the capped end 644 is applied and the locking member 64 then deforms. The locking member 64 moves towards the circuit board 40 until the end surface of the opening end 646 resists against the circuit board 40. The clamping hook 6282 is clamped in one clamping depression 6428. Finally, the top cover 13 is mounted on the bottom housing 11.

The locking member 64 of the electronic device 100 can be made of plastic or elastic materials. The circuit board 40 will not be damaged because the circuit board 40 is clamped on the guiding post 62 by the locking member 64 without using other tools. In addition, the electronic or electrical signals will not be disturbed because the locking member 64 is not made of metal.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A locking assembly, comprising: a guiding post comprising a locking portion comprising a clamp hook formed on a flange of the locking portion; and a locking member defining an opening end adjacent to the guiding post, and being sleeved on the locking portion of the guiding post, wherein at least two buffer grooves are formed in the locking member and are substantially parallel to each other and offset on opposite sides of a central axis of the locking member, wherein the at least two buffer grooves extend along a direction of the central axis of the locking member from an end surface of the opening end towards another end of the locking member, such that at least two clamping portions positioned away from the opening end are formed on separate inner walls of the locking member, each clamping portion comprises a plurality of clamping depressions for adjustably engaging with the clamp hook, and the clamp hook is clamped in the at least two clamping portions.

2. The locking assembly of claim 1, wherein the locking member is made of plastic materials.

3. The locking assembly of claim 1, wherein each clamping portion is formed between two buffer grooves of the at least two buffer grooves.

4. The locking assembly of claim 1, wherein the guiding post further comprises a guiding portion, and the guiding portion connects the locking portion.

5. The locking assembly of claim 4, wherein the guiding post further comprises a support portion, the guiding portion is connected between the support portion and the locking portion.

6. The locking assembly of claim 5, wherein the guiding portion and the locking portion are aligned in a same axis; a diameter of the guiding portion is smaller than a diameter of the support portion; a guiding surface is formed on an end surface of the support portion connecting with the guiding portion.

7. The locking assembly of claim 1, wherein a width of each clamping depression of the plurality of clamping depressions corresponds to a height of the clamp hook.

8. An electronic device, comprising: a housing; a circuit board detachably positioned in the housing; and at least one locking assembly, comprising: a guiding post comprising a locking portion comprising a clamp hook formed on a flange of the locking portion; and a locking member defining an opening end adjacent to the guiding post, and being sleeved on the locking portion of the guiding post, wherein at least two buffer grooves are formed in the locking member and are substantially parallel to each other and offset on opposite sides of a central axis of the locking member, wherein the at least two buffer grooves extend along a direction of the central axis of the locking member from an end surface of the opening end towards another end of the locking member, such that at least two clamping portions positioned away from the opening end are formed on separate inner walls of the locking member, each clamping portion comprises a plurality of clamping depressions for adjustably engaging with the clamp hook, and the clamp hook is clamped in the at least two clamping portions for fixing the circuit board on the guiding post within the housing.

9. The electronic device of claim 8, wherein the locking member is made of plastic elastic materials.

10. The locking assembly of claim 8, wherein each clamping portion is formed between two buffer grooves of the at least two buffer grooves.

11. The electronic device of claim 8, wherein the guiding post further comprises a support portion and a guiding portion, the guiding portion is connected between the support portion and the locking portion; the support portion is fixed to the housing; the circuit board sleeves on the guiding portion.

12. The electronic device of claim 11, wherein the guiding portion and the locking portion are in a same axis; a diameter of the guiding portion is smaller than a diameter of the support portion; a guiding surface is formed on an end surface of the support portion connecting with the guiding portion; the guiding surface resists against the circuit board.

13. The electronic device of claim 12, wherein at least one installation hole is defined through the circuit board, a diameter of the guiding portion is equal to a diameter of the at least one installation hole.

14. The electronic device of claim 8, wherein a width of each clamping depression is corresponding corresponds to a height of the clamp hook.

* * * * *